(12) United States Patent
Jiang et al.

(10) Patent No.: US 7,427,878 B2
(45) Date of Patent: Sep. 23, 2008

(54) LOW-VOLTAGE DIFFERENTIAL SIGNAL DRIVER FOR HIGH-SPEED DIGITAL TRANSMISSION

(75) Inventors: Jian Hong Jiang, Sunnyvale, CA (US); Yoichi Koyanagi, Saratoga, CA (US)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 11/421,522

(22) Filed: Jun. 1, 2006

(65) Prior Publication Data

US 2007/0279098 A1 Dec. 6, 2007

(51) Int. Cl.
*H03K 19/0175* (2006.01)
*H03K 19/094* (2006.01)

(52) U.S. Cl. .............................. 326/83; 326/82; 326/88

(58) Field of Classification Search ............. 326/62–92, 326/9–15, 21–34, 59–60
See application file for complete search history.

(56) References Cited

U.S. PATENT DOCUMENTS

| | | | | |
|---|---|---|---|---|
| 6,111,431 | A | 8/2000 | Estrada | 326/83 |
| 6,262,606 | B1* | 7/2001 | Tamjidi | 327/108 |
| 6,313,662 | B1 | 11/2001 | Ide | 326/83 |
| 6,353,334 | B1 | 3/2002 | Schultz | 326/82 |
| 6,992,508 | B2 | 1/2006 | Chow | 326/86 |
| 7,135,887 | B1* | 11/2006 | Shumarayev et al. | 326/38 |
| 7,301,371 | B2* | 11/2007 | Kim | 326/82 |
| 2001/0040466 | A1* | 11/2001 | Ide | 326/83 |
| 2003/0197534 | A1 | 10/2003 | Feng | 327/141 |
| 2004/0032282 | A1 | 2/2004 | Lee et al. | 326/39 |
| 2005/0179466 | A1* | 8/2005 | Kasanyal et al. | 326/87 |
| 2005/0285629 | A1* | 12/2005 | Hein et al. | 326/115 |
| 2006/0125533 | A1 | 6/2006 | Kim et al. | 327/112 |

OTHER PUBLICATIONS

Ng et al., "Low Power Gbit/sec Low Voltage Differential Signaling I/O System," Electrical Engineering and Computer Science, University of California, Berkeley, 7 pages, http://www.ocf.berkeley.edu/~eng/classes/241Report.pdf, Jun. 29, 2006.
Patent Pending U.S. Appl. No. 11/421,239, entitled "Low-Voltage Differential Signal Driver for High-Speed Digital Transmission," by Jian Hong Jiang, 15 pages plus 2 drawing pages, filed May 31, 2006.
Patent Pending U.S. Appl. No. 11/421,256, entitled "Low-Voltage Differential Signal Driver for High-Speed Digital Transmission," by Jian Hong Jiang, 17 pages plus 3 drawing pages, filed May 31, 2006.

* cited by examiner

*Primary Examiner*—Rexford Barnie
*Assistant Examiner*—Matthew C Tabler
(74) *Attorney, Agent, or Firm*—Baker Botts L.L.P.

(57) ABSTRACT

A low-voltage differential signal (LVDS) driver includes at least two programmable fingers operable to drive a signal and at least two pre-drivers. Each pre-driver is associated with one or more of the programmable fingers and is operable to enable or disable the associated one or more programmable fingers. An enabled programmable finger drives the signal and contributes to the capacitive loading of the driver, and a disabled programmable finger does not drive the signal and does not contribute to the capacitive loading of the driver.

19 Claims, 2 Drawing Sheets

LOW-VOLTAGE DIFFERENTIAL SIGNAL DRIVER FOR HIGH-SPEED DIGITAL TRANSMISSION

TECHNICAL FIELD

This invention relates generally to signal communication, and more specifically, to a low-voltage differential signal (LVDS) driver for high-speed digital transmission.

BACKGROUND

Various Complementary Metal-Oxide Semiconductor (CMOS) driver architectures exist for high-speed digital transmission. The CMOS driver architectures have difficulty meeting standards that require large output amplitude swing and high speed in a single driver. The large internal capacitive loading contributes to this difficulty and additionally results in a large return loss.

SUMMARY OF THE DISCLOSURE

In accordance with the present invention, disadvantages and problems associated with previous techniques for providing a large output voltage swing at low transmission speeds and lower output voltage swing at high transmission speeds in a single driver may be reduced or eliminated.

According to one embodiment of the present invention, a low-voltage differential signal (LVDS) driver includes at least two programmable fingers operable to drive a signal and at least two pre-drivers. Each pre-driver is associated with one programmable finger and is operable to enable or disable the associated programmable finger. An enabled programmable finger drives the signal and contributes to the capacitive loading of the driver, and a disabled programmable finger does not drive the signal and does not contribute to the capacitive loading of the driver.

Certain embodiments of the invention may provide one or more technical advantages. A technical advantage of one embodiment includes supporting standards that require a large output amplitude swing and a high-speed data rates in a single driver. For example, a single LVDS driver supports a large output voltage swing at low transmission speeds and supports a lower output voltage swing at high transmission speeds. Another technical advantage of another embodiment includes using a selected number of programmable fingers for an application based on the requirements of the application. Configuring the appropriate number of programmable fingers for an application saves power. Adjusting the number of programmable fingers used in an application also improves return loss.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
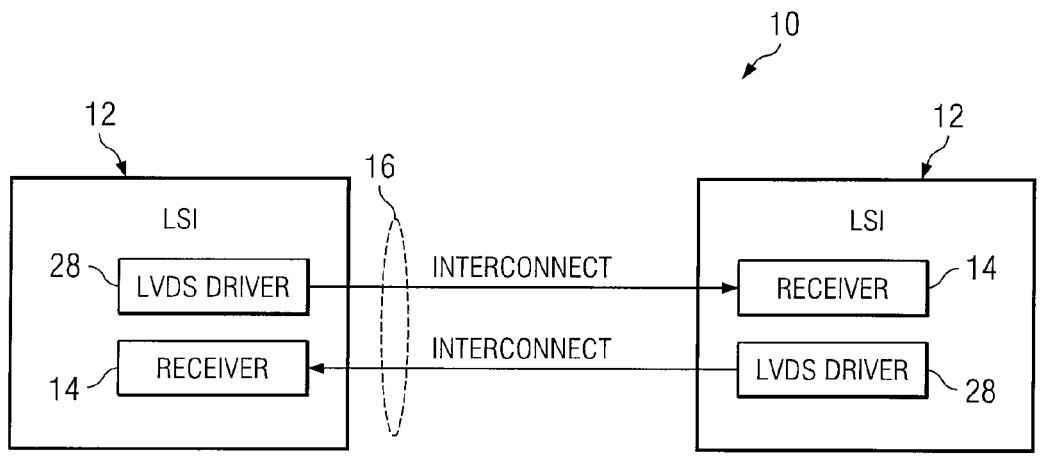
FIG. 1 illustrates one embodiment of a network element for digital transmission between large-scale integration integrated circuits having an LVDS driver for high-speed digital transmission.
Figure 2:
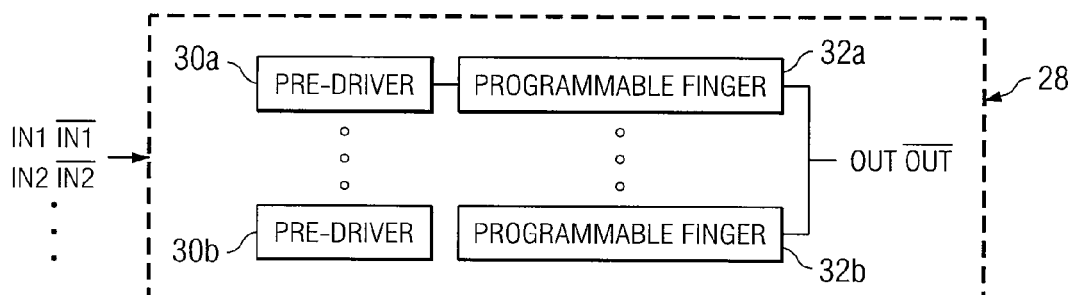
FIG. 2 illustrates a block diagram of the LVDS driver for providing a large output voltage swing and high-speed digital transmission.
Figure 3:
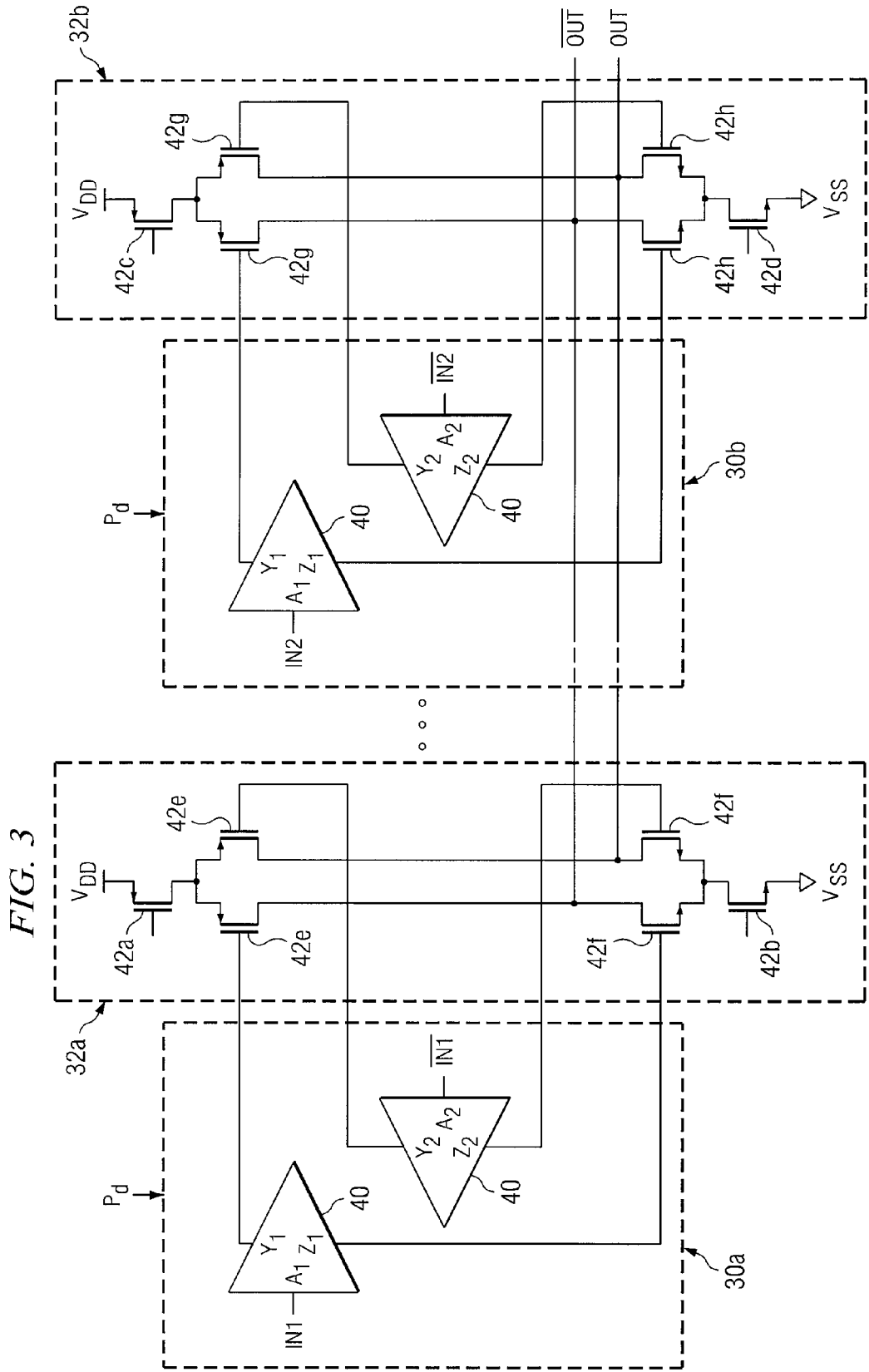
FIG. 3 illustrates an embodiment of a circuit-level diagram of the LVDS driver.

Embodiments of the present invention and its advantages are best understood by referring to FIGS. 1 through 3 of the drawings, like numerals being used for like and corresponding parts of the various drawings.

FIG. 1 illustrates one embodiment of a network element 10 for digital transmission between large-scale integration (LSI) integrated circuits (ICs) 12 having an LVDS driver 28 for high-speed digital transmission. In the illustrated embodiment, network element 10 includes a plurality of LSI ICs 12. LSI ICs 12 include a receiver 14 and an LVDS driver 28 coupled by an interconnect 16. Receiver 14 receives packets from LVDS driver 28. Receiver 14 may include any suitable receiver. Reference to packets may include a packet, datagram, frame, or other unit of data. LVDS driver 28 drives differential signals for high-speed digital transmission from LSI IC 12. Interconnect 16 facilitates transmission of packets between LVDS driver 28 and receiver 14. Interconnect 16 may include any suitable element, such as a cable or a print circuit board trace.

It should be noted that although LVDS driver 28 is illustrated as being used in LSI IC 12 of network element 10, embodiments of the present invention may be used in any suitable network element in any suitable network or in any other appropriate application requiring digital signal transmission.

FIG. 2 illustrates a block diagram of LVDS driver 28 for providing a large output voltage swing and high-speed digital transmission. Traditional driver architectures have large internal capacitive loading. The large internal capacitive loading causes difficulty in meeting standards that require the large output voltage swing at lower transmission speeds and a lower output voltage swing at higher transmission speeds.

In the illustrated embodiment, LVDS driver 28 includes pre-drivers 30 and programmable fingers 32 and receives inputs IN1, $\overline{IN1}$, IN2, and $\overline{IN2}$. A programmable finger 32 may be associated with a pre-driver 30. For example, pre-driver 30a is associated with programmable finger 32a, and pre-driver 30b is associated with programmable finger 32b. Pre-drivers 30 control the operation of the associated programmable finger 32. Programmable fingers 32 may be selectively engaged or disengaged from LVDS driver 28. Therefore, the number of engaged programmable fingers 32 may be used to control the total capacitive loading and maximum voltage swing provided by LVDS driver 28 (since each programmable finger 32 contributes to both the capacitive loading and to the maximum voltage swing). For example, during high-speed transmission that has a lower required output voltage swing but more sensitivity to capacitive loading, a lower number of programmable fingers 32 may be enabled to reduce the total capacitive loading. For example, at 10.4 Gigabits per second, the output amplitude is 300 mV for a single-end circuit and 600 mV for a differential circuit. On the other hand, during low-speed transmission that has a higher required output voltage swing but less sensitivity to capacitive loading, a higher number of programmable fingers 32 may be enabled. For example, at 3.125 Gigabits per second, the output amplitude is 600 mV for a single-end circuit and 1200 mV for a differential circuit.

As an example only, LVDS driver 28 may include five programmable fingers 32, and different applications may require the operation of a different number of programmable fingers 32. Each of the pre-drivers 30 associated with the needed programmable fingers 32 enables the associated programmable fingers 32, and the remaining pre-drivers 30 disable their associated programmable fingers 32. For example, in a particular exemplary embodiment, two programmable fingers 32 may be turned on for 10 G (ten Gigabits per second) operation and up to five programmable fingers 32 may be turned on for 3 G operation (three Gigabits per second). LVDS driver 28 may operate at any suitable transmission speed for any suitable application.

FIG. 3 illustrates an embodiment of a circuit-level diagram of the LVDS driver 28. In the illustrated embodiment, LVDS driver 28 includes a pre-driver logic 40 and transistors 42. Pre-driver logic 40 may include any suitable component. In the illustrated embodiment, each pre-driver 30 includes pre-driver logic 40. Programmable fingers 32 include transistors 42. In the illustrated embodiment, programmable fingers 32 include p-channel metal-oxide semiconductor field effect transistors (PMOS transistors) as illustrated by transistors 42a, 42c, 42e, and 42g and an n-channel metal-oxide semiconductor field effect transistors (NMOS transistors) as illustrated by transistors 42b, 42d, 42f, and 42h.

In the illustrated embodiment, transistors 42a and 42c couple to a Direct Current (DC) voltage source ($V_{DD}$) and operate as a source-type current source. Transistors 42b and 42d couple to voltage source ($V_{SS}$) and operate as a sink-type current source. As another example, a cascode current mirror may be implemented to form the current source. Transistors 42e, 42f, 42g, and 42h operate as a complementary switch.

Each programmable finger 32 may be completely enabled or disabled by their associated pre-driver 30 depending on the application. Providing a signal to pre-driver 30 at $P_D$ allows pre-driver 30 to control and enable programmable fingers 32. When a selected programmable finger 32a is enabled, $Y_1$ and $Z_1$ are the same as $A_1$ and $Y_2$ and $Z_2$ are the same as $A_2$. As indicated in the table below, the values of $A_1$ and $A_2$ determine the values of $Y_1$, $Z_1$, $Y_2$, and $Z_2$. When selected programmable finger 32a is disabled, $Y_1$ and $Y_2$ have values equal to $V_{DD}$ and $Z_1$ and $Z_2$ have values equal to $V_{SS}$. The following table illustrates the logic functions:

| $P_D$ | $A_1$ | $A_2$ | $Y_1$ | $Y_2$ | $Z_1$ | $Z_2$ |
|---|---|---|---|---|---|---|
| 0 | 0 | 1 | 0 | 1 | 0 | 1 |
| 0 | 1 | 0 | 1 | 0 | 1 | 0 |
| 1 | X | X | 1 | 1 | 0 | 0 |

When $P_D$ has a logic value of zero, programmable finger 32 is enabled. Alternatively, when $P_D$ has a logic value of one, regardless of the input signals $A_1$ and $A_2$, programmable finger 32 is disabled. The above logic table is applicable to programmable finger 32b when enabled and disabled. When programmable finger 32 is disabled, the components in programmable finger 32 do not contribute any internal capacitive loading at output nodes, OUT and $\overline{OUT}$. The output voltage swing depends on total currents added by active programmable fingers 32, the loading at the output nodes, and the switching PMOS and NMOS loading paths.

In operation, upon determining which programmable fingers 32 to enable and which programmable fingers 32 to disable, pre-drivers 30 enable and disable the programmable fingers 32. Any suitable number of programmable fingers 32 are enabled or disabled to accommodate the requirements of an application. An input is provided at $P_D$ on pre-driver 30, which allows for control of associated programmable finger 32. As described above, when $P_D$=1, programmable finger 32 is disabled and $Y_1$=$Y_2$=$V_{DD}$ and $Z_1$=$Z_2$=$V_{SS}$. As another example, when $P_D$=0 and input signals $A_1$ and $A_2$ have logic values of zero or one, programmable finger 32 is enabled and $Y_1$,$Z_1$=$A_1$ and $Y_2$,$Z_2$=$A_2$. The application proceeds accordingly based on the configuration of enabled and disabled programmable fingers 32. The configuration of enabled and disabled programmable fingers 32 may change to facilitate another application. In an embodiment, a total of disabled and enabled programmable fingers 32 is at least two programmable fingers 32.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A low-voltage differential signal (LVDS) driver, comprising:
   a high speed component comprising a first set of two or more programmable fingers;
   a low speed component comprising a second set of two or more programmable fingers;
   a plurality of pre-drivers, each pre-driver associated with a programmable finger of either the high speed component or the low speed component and operable to enable or disable the associated programmable finger, an enabled programmable finger driving a signal and contributing to capacitive loading of the driver, and a disabled programmable finger not driving the signal and not contributing to the capacitive loading of the driver;
   wherein the drivers are configured to enable the programmable fingers of the high speed component to drive the signal at a high speed;
   wherein the drivers are configured to enable the programmable fingers of the high speed component and the programmable fingers of the low speed component to drive the signal at a low speed to contribute to the capacitive loading of the driver.

2. The driver of claim 1, wherein each pre-driver comprises pre-driver logic.

3. The driver of claim 1, wherein the programmable finger comprises a plurality of transistors, the plurality of transistors comprising a plurality of p-channel metal-oxide field effect transistors and a plurality of n-channel metal-oxide field effect transistors.

4. The driver of claim 1, comprising five programmable fingers and wherein two of the programmable fingers are enabled to facilitate the transmission of the signal at the high speed, wherein the driver has a low output voltage swing.

5. The driver of claim 4, wherein the high speed transmission is greater than or equal to approximately ten Gigabits per second and the low output voltage swing of a differential circuit is less than or equal to approximately 600 mV and the low output voltage swing of a single-end circuit is less than or equal to approximately 300 mV.

6. The driver of claim 1, comprising five programmable fingers and wherein the five programmable fingers are enabled to facilitate the transmission of a signal at the low speed, wherein the driver has a high output voltage swing.

7. The driver of claim 6, wherein the low speed transmission is less than or equal to approximately three Gigabits per second and the high output voltage swing of a differential circuit is greater than or equal to approximately 1200 mV and the high output voltage swing of a single-end circuit is greater than or equal to approximately 600 mV.

8. A method for driving a low-voltage differential signal (LVDS), comprising:
selectively enabling a first set of two or more programmable fingers of a high speed component;
selectively enabling a second set of two or more programmable fingers of a low speed component;
wherein a programmable finger of either the high speed component or the low speed component is operable to drive a signal, an enabled programmable finger driving the signal and contributing to capacitive loading of a driver, and a disabled programmable finger not driving the signal and not contributing to the capacitive loading of the driver;
wherein selectively enabling a first set of two or more programmable fingers comprises enabling the programmable fingers of the high speed component to drive the signal at a high speed;
wherein selectively enabling a second set of two or more programmable fingers comprises enabling the programmable fingers of the high speed component and the programmable fingers of the low speed component to drive the signal at a low speed to contribute to the capacitive loading of the driver.

9. The method of claim 8, wherein selectively enabling either the first set of two or more programmable fingers or the second set of two or more programmable fingers comprises receiving a signal at the driver.

10. The method of claim 8, wherein selectively enabling either the first set of two or more programmable fingers or the second set of two or more programmable fingers comprises receiving an input having a logic value of zero or one.

11. The method of claim 8, wherein selectively enabling the first set of two or more programmable fingers comprises:
enabling two programmable fingers to facilitate the transmission of the signal at the high speed; and
having a low output voltage swing.

12. The method of claim 11, wherein the high speed transmission is greater than or equal to approximately ten Gigabits per second and the low output voltage swing of a differential circuit is less than or equal to approximately 600 mV and the low output voltage swing of a single-end circuit is less than or equal to approximately 300 mV.

13. The method of claim 8, wherein selectively enabling the first set of two or more programmable fingers and the second set of two or more programmable fingers comprises:
enabling five programmable fingers to facilitate the transmission of the signal at the low speed; and
having a high output voltage swing.

14. The method of claim 13, wherein the low speed transmission is less than or equal to approximately three Gigabits per second and the high output voltage swing of a differential circuit is greater than or equal to approximately 1200 mV and the high output voltage swing of a single-end circuit is greater than or equal to approximately 600 mV.

15. A system for driving a low-voltage differential signal (LVDS), comprising:
means for driving a signal;
means for selectively enabling a first set of two or more programmable fingers of a high speed component;
means for selectively enabling a second set of two or more programmable fingers of a low speed component;
wherein an enabled driving means drives the signal and contributes to the capacitive loading of driving means, and a disabled driving means does not drive the signal and does not contribute to the capacitive loading of the driving means;
wherein means for selectively enabling a first set of two or more programmable fingers comprises means for enabling the programmable fingers of the high speed component to drive the signal at a high speed;
wherein means for selectively enabling a second set of two or more programmable fingers comprises means for enabling the programmable fingers of the high speed component and the programmable fingers of the low speed component to drive the signal at a low speed to contribute to the capacitive loading of the driver.

16. The system of claim 15, further comprising means for receiving a signal at the driver.

17. The system of claim 15, further comprising means for receiving an input having a logic value of zero or one.

18. The system of claim 15, further comprising:
means for driving the signal at the high speed; and
means for having a low output voltage swing.

19. The system of claim 15, further comprising:
means for driving the signal at the low speed; and
means for having a high output voltage swing.

* * * * *